United States Patent
Yamamoto et al.

(10) Patent No.: US 7,924,896 B2
(45) Date of Patent: Apr. 12, 2011

(54) OPTICAL SEMICONDUCTOR DEVICE

(75) Inventors: Tsuyoshi Yamamoto, Kawasaki (JP);
Manabu Matsuda, Kawasaki (JP);
Mitsuru Ekawa, Kawasaki (JP); Kan Takada, Kawasaki (JP); Shigekazu Okumura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/234,161

(22) Filed: Sep. 19, 2008

(65) Prior Publication Data
US 2009/0052487 A1  Feb. 26, 2009

Related U.S. Application Data

(63) Continuation of application No. PCT/JP2006/305743, filed on Mar. 22, 2006.

(51) Int. Cl.
*H01S 3/04* (2006.01)
(52) U.S. Cl. ................... 372/43.01; 372/46.01
(58) Field of Classification Search .............. 372/39, 372/43.01, 44.01, 45.01, 45.011, 46.01
See application file for complete search history.

(56) References Cited

U.S. PATENT DOCUMENTS

| | | | | |
|---|---|---|---|---|
| 2002/0071462 A1* | 6/2002 | Takemoto et al. | ............... | 372/43 |
| 2004/0066818 A1* | 4/2004 | Yamamoto et al. | ............. | 372/45 |
| 2005/0147145 A1* | 7/2005 | Behfar et al. | .................. | 372/64 |

FOREIGN PATENT DOCUMENTS

| | | |
|---|---|---|
| JP | 6-112530 A | 4/1994 |
| JP | 9-36494 A | 2/1997 |
| JP | 2002-26457 A | 1/2002 |
| JP | 2005-243743 A | 9/2005 |

OTHER PUBLICATIONS

International Search Report of PCT/JP2006/305743, date of mailing Apr. 18, 2006.

* cited by examiner

*Primary Examiner* — Minsun Harvey
*Assistant Examiner* — Xnning Niu
(74) *Attorney, Agent, or Firm* — Westerman, Hattori, Daniels & Adrian, LLP

(57) ABSTRACT

An optical semiconductor device includes an active layer, a first semiconductor layer formed above the active layer and made from a semiconductor material containing Al, a second semiconductor layer formed above the first semiconductor layer and made from a semiconductor material which does not contain any one of Al and P and whose band gap is greater than that of the active layer, and a third semiconductor layer formed above the second semiconductor layer and made from a semiconductor material which does not contain Al but contains P. The second semiconductor layer is formed such that the first semiconductor layer and the third semiconductor layer do not contact with each other.

20 Claims, 5 Drawing Sheets

OPTICAL SEMICONDUCTOR DEVICE

CROSS REFERENCE TO RELATED APPLICATION(S)

This application is continuation of an International Application No. PCT/JP2006/305743 which was filed on Mar. 22, 2006, in Japan, which is herein incorporated by reference.

BACKGROUND

1) Field

The embodiment relates to an optical semiconductor device.

2) Description of the Related Art

In recent years, together with downsizing and reduction of power consumption of a module for optical communication, an optical device which can operate also at a high temperature such as a semiconductor laser, an optical modulator or the like is demanded.

Mainly, an InGaAsP-based material has been and is being used for an optical device used for an optical fiber communication system.

Recently, development of an optical device for which an AlGaInAs-based material is used and which can implement sufficient high-speed operation at a high temperature due to the superior band structure of a hetero-junction is advancing.

Further, an optical device having a buried heterostructure attracts attention because driving current can be reduced and speedup can be anticipated thereby.

Here, FIG. 5 shows a configuration of a conventional buried-type (buried-heterostructure) semiconductor laser (optical semiconductor device) made from an AlGaInAs-based semiconductor material.

As shown in FIG. 5, the conventional AlGaInAs-based buried-heterostructure semiconductor laser has a structure (pnpn current blocking structure) formed in such a manner that an n-side AlGaInAs optical guide layer 101, an AlGaInAs/AlGaInAs strained multiple quantum well (MQW; Multiple Quantum Well) active layer 102, a p-side AlGaInAs optical guide layer 103, a part of p-type InP cladding layer 104 are stacked in order on an n-type InP substrate 100, when necessary, with an InP buffer layer (not shown) interposed therebetween, and the stacked structure is processed into a mesa shape and buried with a p-type InP burying layer and an n-type InP burying layer (pn burying layer 106), then a part of p-type InP cladding layer 104 and a p-type InGaAs contact layer 105 are formed.

Also semiconductor lasers having other waveguide structures such as other buried heterostructures wherein the mesa-shaped structure is buried with a high-resistance semiconductor layer (semi-insulating buried heterostructure; SI—BH structure) or a ridge structure are available.

In a buried-heterostructure semiconductor laser having such an AlGaInAs-based multiple quantum well active layer as described above, since a quantum well on the conduction band side for electrons whose effective mass is small is deep and a quantum well on the valence band side for holes whose effective mass is large is shallow, the temperature dependence of the current-light output characteristic is small. Further, since the semiconductor laser has the buried structure, the relaxation oscillation frequency is high.

On the other hand, if an electric field absorption type modulator is configured so as to include an AlGaInAs-based multiple quantum well active layer, then a steep extinction characteristic with respect to the voltage is obtained.

It is to be noted that Japanese Patent Laid-Open No. 9-36494 and Japanese Patent Laid-Open No. 2002-26457 have been found as a result of research for the prior art.

SUMMARY

There is provided an optical semiconductor device, including an active layer, a first semiconductor layer formed above the active layer and made from a semiconductor material containing Al, a second semiconductor layer formed above the first semiconductor layer and made from a semiconductor material which does not contain any one of Al and P and whose band gap is greater than that of the active layer, and a third semiconductor layer formed above the second semiconductor layer and made from a semiconductor material which does not contain Al but contains P, and wherein the second semiconductor layer is formed such that the first and third semiconductor layers do not contact with each other.

DESCRIPTION OF THE PREFERRED EMBODIMENT

It was found that, when an optical semiconductor device such as a semiconductor laser which includes an AlGaInAs-based multiple quantum well active layer configured in such a manner as described above is compared with a conventional optical semiconductor device made from an InGaAsP-based semiconductor material, although a good device characteristic is obtained at an early stage, if a reliability test with current injection is carried out, then there is the possibility that the device characteristic may be drastically degraded.

When the inventors of the present application produced an AlGaInAs-based buried-heterostructure semiconductor laser (refer to FIG. 5; for example, a cavity length is 300 μm) configured in such a manner as described above and conducted a reliability test, a case was observed quite frequently wherein, after the continuous current injection for one-hundred hours, the optical output decreased by 90% or more and degradation was exhibited.

It is to be noted that, also with other optical semiconductor devices which have a structure similar to that of the buried-heterostructure semiconductor laser described above, there is the possibility that degradation by continuous current injection may occur similarly. Further, also with optical semiconductor devices which have a semiconductor layer containing Al provided in the proximity of an active layer, there is the possibility that degradation by continuous current injection may occur similarly.

Therefore, an embodiment provides an optical semiconductor device which can suppress degradation by continuous current injection.

In the following, an optical semiconductor device according to an embodiment is described with reference to FIGS. 1 to 4 of the drawings.

The optical semiconductor device according to the present embodiment is a semiconductor laser (1.3 μm band buried-heterostructure semiconductor laser) including an active layer made from, for example, an AlGaInAs-based (including AlGaInAs, InGaAs and InAlAs) semiconductor material and a pnpn current blocking structure (pnpn-BH structure: pnpn Buried Heterostructure) is applied to the present optical semiconductor device. The optical semiconductor device is used, for example, with an optical fiber communication system.

Figure 1:
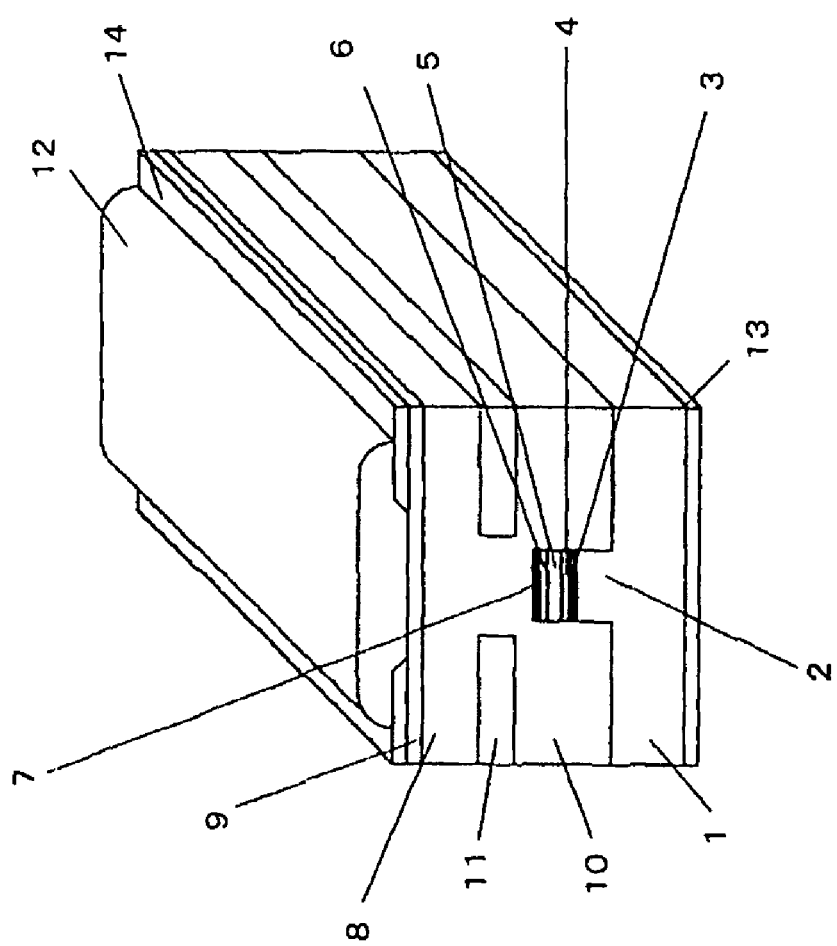
FIG. 1 is a schematic perspective view showing a configuration of an optical semiconductor device (buried-heterostructure semiconductor laser) according to an embodiment.

In particular, as shown in FIG. 1, the present buried-heterostructure semiconductor laser has a structure formed in such a manner that, as occasion demands, an n-type buffer layer 2 (sixth semiconductor layer; for example, 0.5 μm), an n-side intermediate layer 3 (fifth semiconductor layer), an n-side optical guide layer 4 (fourth semiconductor layer), an AlGaInAs/AlGaInAs strained multiple quantum well (MQW) active layer 5, a p-side optical guide layer (first semiconductor layer) 6, a p-side intermediate layer 7 (second semiconductor layer), a p-type InP upper cladding layer 8 (third semiconductor layer; for example, the overall thickness is 3 μm), a p-type InGaAs contact layer 9 (for example, the thickness is 0.5 μm), a p-type InP burying layer 10 (current blocking layer), an n-type InP burying layer 11 (current blocking layer), a p-side electrode 12, an n-side electrode 13, and a $SiO_2$ film (insulating film) 14 are provided on an n-type InP substrate 1 (sixth semiconductor layer). It is to be noted that, since the n-type InP substrate 1 and the n-type InP buffer layer 2 function as cladding layers, they are hereinafter referred to as n-type InP lower cladding layer.

In the present embodiment, the AlGaInAs/AlGaInAs strained multiple quantum well (MQW) active layer 5 is made from an AlGaInAs-based (including AlGaInAs, InGaAs and InAlAs) semiconductor material (semiconductor material containing Al), and has a strained multiple quantum well structure (structure wherein AlGaInAs layers whose compositions are different from each other are stacked) wherein, for example, ten layers of a 1.2% compressive strained AlGaInAs well layer of 4.2 nm thick and an AlGaInAs barrier layer having a band gap wavelength of 1.05 μm and a thickness of 10 nm are stacked.

The p-side optical guide layer 6 is made from an AlGaInAs-based (including AlGaInAs and InAlAs) semiconductor material, and has a band gap wavelength of 1.05 μm and a thickness of 20 nm. In particular, the first semiconductor layer 6 (p-side AlGaInAs-based optical guide layer; upper optical guide layer) made from a semiconductor material containing Al is formed above the active layer 5.

The p-side intermediate layer 7 is formed above the p-side optical guide layer 6 and is made from an InGaAs-based (including InGaAs and GaAs) semiconductor material. In particular, the second semiconductor layer 7 (p-side InGaAs-based intermediate layer; upper intermediate layer) made from a semiconductor material which does not contain any one of Al and P is formed above the p-side optical guide layer 6.

The p-type InP upper cladding layer 8 is formed above the p-side InGaAs-based intermediate layer 7. In particular, the third semiconductor layer 8 (p-type InP upper cladding layer) made from a semiconductor material which does not contain Al but contains P is formed above the p-side InGaAs-based intermediate layer 7.

Then, the p-side InGaAs-based intermediate layer 7 (second semiconductor layer) is formed such that the p-side AlGaInAs-based optical guide layer 6 (first semiconductor layer) and the p-type InP upper cladding layer 8 (third semiconductor layer) do not contact with each other.

In this manner, in the present embodiment, since the p-side InGaAs-based intermediate layer 7 is inserted between the p-side AlGaInAs-based optical guide layer 6 and the p-side InP upper cladding layer 8, degradation by continuous current injection can be suppressed. While a definite mechanism of the degradation by continuous current injection is not yet obtained, it is considered that, where P is introduced on Al which has a high reactivity, a material different from mixed crystal to be originally formed is formed on an interface such that a crystal defect is induced, and as a result, degradation by continuous current injection occurs.

On the other hand, the n-side optical guide layer 4 is made from an AlGaInAs-based (including AlGaInAs and InAlAs) semiconductor material, and, for example, has a band gap wavelength of 1.05 μm and a thickness of 20 nm. In particular, the fourth semiconductor layer 4 (n-side AlGaInAs-type optical guide layer; lower optical guide layer) made from a semiconductor material containing Al is formed under the active layer 5.

The n-side intermediate layer 3 is formed under the n-side optical guide layer 4 and made from an InGaAs-based (including InGaAs and GaAs) semiconductor material. In particular, the fifth semiconductor layer 3 (n-side InGaAs-based intermediate layer; lower intermediate layer) made from a semiconductor material which does not contain any one of Al and P is formed under the n-side optical guide layer 4.

The n-type InP buffer layer 2 (n-type InP lower cladding layer) is formed under the n-side InGaAs-based intermediate layer 3. In particular, the sixth semiconductor layer 2 (n-type InP buffer layer; n-type InP lower cladding layer) made from a semiconductor material which does not contain Al but contains P is formed under the n-side InGaAs-based intermediate layer 3. It is to be noted that, where the n-type InP buffer layer 2 is not provided, an n-type InP substrate (n-type InP lower cladding layer) 1 is provided, as the sixth semiconductor layer made from a semiconductor material which does not contain Al but contains P, under the n-side InGaAs-based intermediate layer 3.

Then, the n-side InGaAs-based intermediate layer 3 (fifth semiconductor layer) is formed such that the n-side AlGaInAs-based optical guide layer 4 (fourth semiconductor layer) and the n-type InP lower cladding layer (here, n-type InP buffer layer 2; where the buffer layer 2 is not provided, n-type InP substrate 1; sixth semiconductor layer) do not contact with each other.

In this manner, since the n-side InGaAs-based intermediate layer 3 is inserted between the n-type InP lower cladding layer (here, n-type InP buffer layer 2; where the buffer layer 2 is not provided, n-type InP substrate 1) and the n-side AlGaInAs-based optical guide layer 4, the crystallinity can be improved.

In particular, in the present embodiment, the p-side InGaAs-based intermediate layer 7 and the n-side InGaAs-based intermediate layer 3 are formed individually as an $In_{0.25}Ga_{0.75}As$ layer of 1 nm thick having comparatively great tensile strain so that the band gaps of the intermediate layers 7 and 3 become greater than that of the active layer 5 and a barrier is prevented from being produced for the InP layer [p-type InP upper cladding layer 8 or the n-type InP lower cladding layer (here, n-type InP buffer layer 2; where the buffer layer 2 is not provided, n-type InP substrate 1).

By applying such a composition as just described, large strain is applied to the p-side InGaAs-based intermediate layer 7 and the n-side InGaAs-based intermediate layer 3 so that the band gaps of the intermediate layers 7 and 3 become greater than that of the active layer 5. The reason why such a configuration as just described is applied is that, since both of the n-side InGaAs-based intermediate layer 3 and the p-side InGaAs-based intermediate layer 7 are provided in the proximity of the active layer 5 and the optical guide layers 4 and 6, it is intended to prevent absorption from occurring with the intermediate layers 3 and 7.

It is to be noted that the composition and the thickness of the p-side InGaAs-based intermediate layer 7 and the n-side InGaAs-based intermediate layer 3 are not limited to those described above, but also it is possible to apply some other composition or some other thickness.

Here, selection of a composition and a thickness may be carried out in such a manner as to satisfy such conditions (1) that a band gap greater than that of the active layer 5 is used and absorption is prevented so that the characteristic is not degraded, (2) that appearance of a crystal defect arising from excessively great grating strain is prevented, and (3) that carrier injection is not obstructed (here, appearance of a barrier for the InP layer is prevented).

Figure 2:
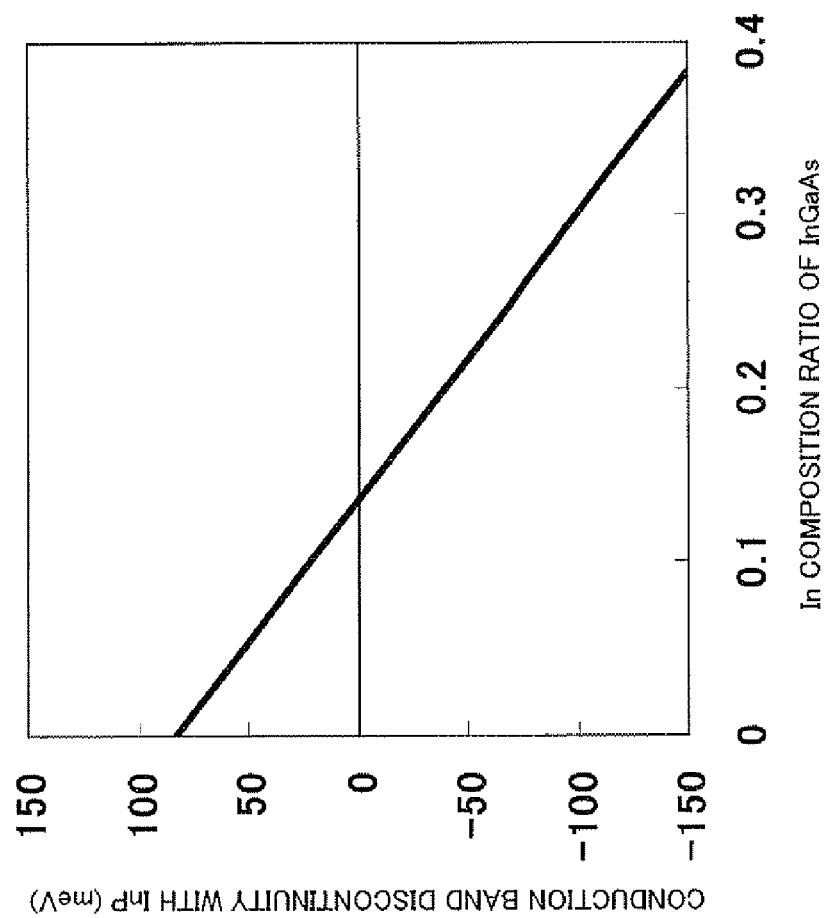
FIG. 2 is a view illustrating calculation values of band discontinuity on the conduction band side between InP and InGaAs with respect to an In composition ratio of an InGaAs layer where the InGaAs layer is formed on an InP substrate.

Here, FIG. 2 illustrates calculation values (conduction band discontinuity values) of band discontinuity on the conduction band side between InP and InGaAs with respect to an In composition ratio of an InGaAs layer where an InGaAs layer is formed on an InP substrate. It is to be noted here that the calculation is carried out using generally reported material parameters.

Where a conduction band discontinuity value (axis of ordinate in FIG. 2) with InP is a positive value, an energy barrier is formed for electrons existing in the InP substrate.

Therefore, in order to eliminate obstruction of carrier injection, it is preferable to select the In composition ratio of the n-side InGaAs-based intermediate layer 3 so that the conduction band discontinuity value (vertical axis in FIG. 2) with InP becomes a negative value.

However, also where the In composition ratio of the n-side InGaAs-based intermediate layer 3 is low and the conduction band discontinuity value with InP becomes a positive value and consequently a barrier is formed, if the thickness is thin, then carriers are injected. Therefore, where the In composition ratio of the n-side InGaAs-based intermediate layer 3 is set to a low value, it is preferable to configure the n-side InGaAs-based intermediate layer 3 as a thin film layer which has a thickness of 2 nm or less with which, even if a barrier appears, it can be tunneled. For example, if the upper limit to the thickness is set to approximately 1 nm, a GaAs intermediate layer can be used as the n-side InGaAs-based intermediate layer 3. It is to be noted that, since GaAs is binary and allows stabilized crystal growth, it is preferable to use GsAs from a point of view of crystal growth.

It is to be noted that, while the optical semiconductor device of the present embodiment satisfies the condition described above, in order to prevent appearance of a crystal defect, the composition and thickness of the p-side InGaAs-based intermediate layer 7 and the n-side InGaAs-based intermediate layer 3 must be set so as to have such values that grating relaxation does not occur upon crystal growth.

Further, since the buried-heterostructure semiconductor laser in the present embodiment is a 1.3 μm wavelength band buried-heterostructure semiconductor laser, while an $In_{0.25}Ga_{0.75}As$ layer of 1 nm thick is used as the p-side InGaAs-based intermediate layer 7 and the n-side InGaAs-based intermediate layer 3, the present invention is not limited to this.

For example, in the case of a 1.55 μm wavelength band buried-heterostructure semiconductor laser, the composition and thickness of the p-side InGaAs-based intermediate layer 7 and the n-side InGaAs-based intermediate layer 3 may be selected such that the band gap is greater than that of the active layer 5 which configures the 1.55 μm band buried-heterostructure semiconductor laser. Therefore, an intermediate layer whose In composition ratio is greater (induced strain is small) than that of the 1.3 μm buried-heterostructure semiconductor laser described above can be used as the p-side InGaAs-based intermediate layer 7 and the n-side InGaAs-based intermediate layer 3.

Further, while, in the present embodiment, the composition and thickness of the p-side InGaAs-based intermediate layer 7 and the composition and thickness of the n-side InGaAs-based intermediate layer 3 are same as each other, the p-side InGaAs-based intermediate layer 7 and the n-side InGaAs-based intermediate layer 3 may be configured as intermediate layers having compositions and thicknesses different from each other.

Incidentally, as shown in FIG. 1, in the present buried-heterostructure semiconductor laser, the mesa structure (striped mesa shape) including the active layer 5 and optical guide layers 4 and 6 is formed and the p-type InP burying layer 10 (current blocking layer) and the n-type InP burying layer 11 (current blocking layer) are formed on the opposite sides of the mesa structure on the n-type InP substrate 1 such that the mesa structure is buried, and then the p-type InP upper cladding layer 8 and the p-type InGaAs contact layer 9 are formed on the buried mesa structure to form a pnpn burying structure. Then, this structure serves as a current blocking structure.

Further, the n-side electrode 13 is, for example, an AuGe electrode and is formed on the back side (lower side) of the substrate (device). On the other hand, the front side (upper side) of the device is covered with the $SiO_2$ film 14 except an upper portion of the active layer 5. Then, for example, a Ti/Pt/Au electrode is formed as the p-side electrode 12 above the active layer 5.

Next, a fabrication method for the optical semiconductor device (AlGaInAs-based buried-heterostructure semiconductor laser) according to the present embodiment is described with reference to FIG. 1.

First, as occasion demands, some of the n-type InP buffer layer 2, n-side InGaAs-based intermediate layer 3, n-side AlGaInAs-based optical guide layer 4, AlGaInAs/AlGaInAs strained multiple quantum well active layer 5, p-side AlGaInAs-based optical guide layer 6, p-side InGaAs-based intermediate layer 7 and p-type InP upper cladding layer 8 are grown in order on the n-type InP substrate 1, for example, by an organometallic vapor phase epitaxy method (MOVPE) to form a stacked structure.

Then, a $SiO_2$ film ($SiO_2$ mask) is formed as a mask for etching on the surface. The $SiO_2$ film is formed by processing, for example, in a striped shape of a width of 1.4 μm using a normal photolithography technique.

Then, using the $SiO_2$ mask, the stacked structure is processed into a mesa shape by a dry etching method such as, for example, an ICP-RIE (Inductively Coupled Plasma Reactive Ion Etching) method or the like, so as to reach to the n-type InP buffer layer 2, thereby to form a mesa structure having, for example, a height of approximately 1.5 μm.

Then, a damage layer formed on the surface of the mesa structure is removed thinly by wet etching, whereafter it is inserted into a MOVPE apparatus, in which a current blocking layer formed from the p-type InP burying layer 10 and the n-type InP burying layer 11 is grown subsequently, for example, by the MOVPE method such that both sides of the mesa structure are buried.

Thereafter, the SiO$_2$ mask on the mesa structure is removed, and the remaining part of the p-type InP upper cladding layer 8 and the p-type InGaAs contact layer 9 is grown on the overall face thereof, for example, by the MOVPE method.

Then, the electrodes 12 and 13 are formed by a normal process. In particular, the SiO$_2$ film (insulating film) 14 is formed first, and then the SiO$_2$ film 14 formed above the active layer 5 is removed, whereafter the p-side electrode 12 made from, for example, Ti/Pt/Au is formed. On the other hand, the n-side electrode 13 made from, for example, AuGe is formed on the back face side of the n-type InP substrate 1.

With the optical semiconductor device according to the present embodiment, there is an advantage that degradation by continuous current injection can be suppressed.

Figure 5:
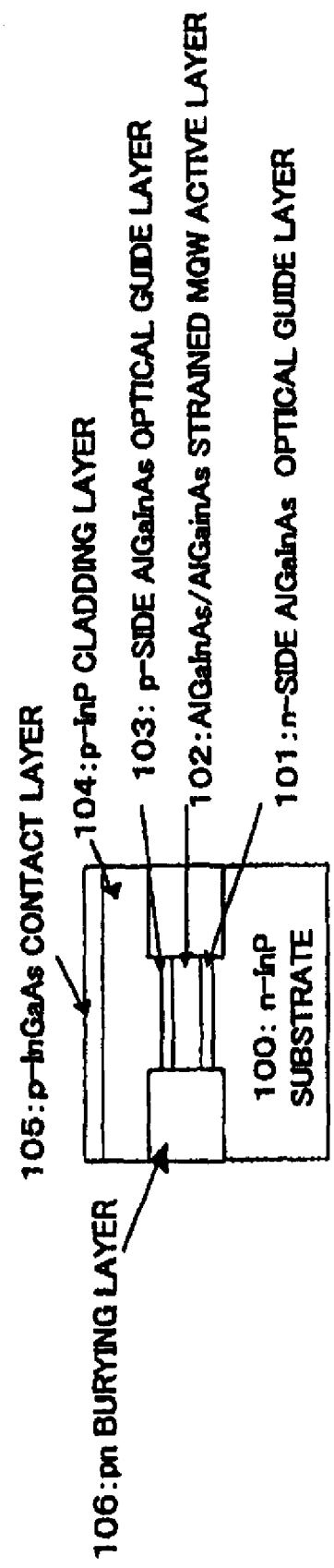
FIG. 5 is a schematic sectional view showing a configuration of a conventional buried-heterostructure semiconductor laser.

The inventors of the present invention produced a semiconductor laser having a structure wherein, in the buried-heterostructure semiconductor laser according to the present embodiment described above, that is, in the semiconductor laser including the AlGaInAs/AlGaInAs strained multiple quantum well (MQW) active layer 5, the InGaAs-based intermediate layers 3 and 7 are inserted between the n-type InP lower cladding layer (here, n-type InP buffer layer 2; where the buffer layer 2 is not provided, n-type InP substrate 1) and the n-side AlGaInAs-based optical guide layer 4 and between the p-side AlGaInAs-based optical guide layer 6 and the p-type InP upper cladding layer 8, respectively, and carried out comparative evaluation with a semiconductor laser having the conventional structure (refer to FIG. 5).

As a result, as described hereinabove, a semiconductor laser having the conventional structure frequently exhibited the phenomenon that, after continuous current injection for one-hundred hours, the optical output decreased by 90% or more and energization degradation was exhibited. On the other hand, it was confirmed that, with the present buried-heterostructure semiconductor laser (for example, cavity length of 300 µm; Fabry-Perot type semiconductor laser) having the structure described above, a good device characteristic similar to that of the semiconductor laser having the conventional structure is obtained at an early stage, and decrease of the optical output can be suppressed to 3% or less also after continuous current injection for one-hundred hours and degradation by continuous current injection can be suppressed.

It is to be noted that the present invention is not limited to the embodiment specifically described above, and variations and modifications can be made without departing from the scope of the present invention.

Figure 3:
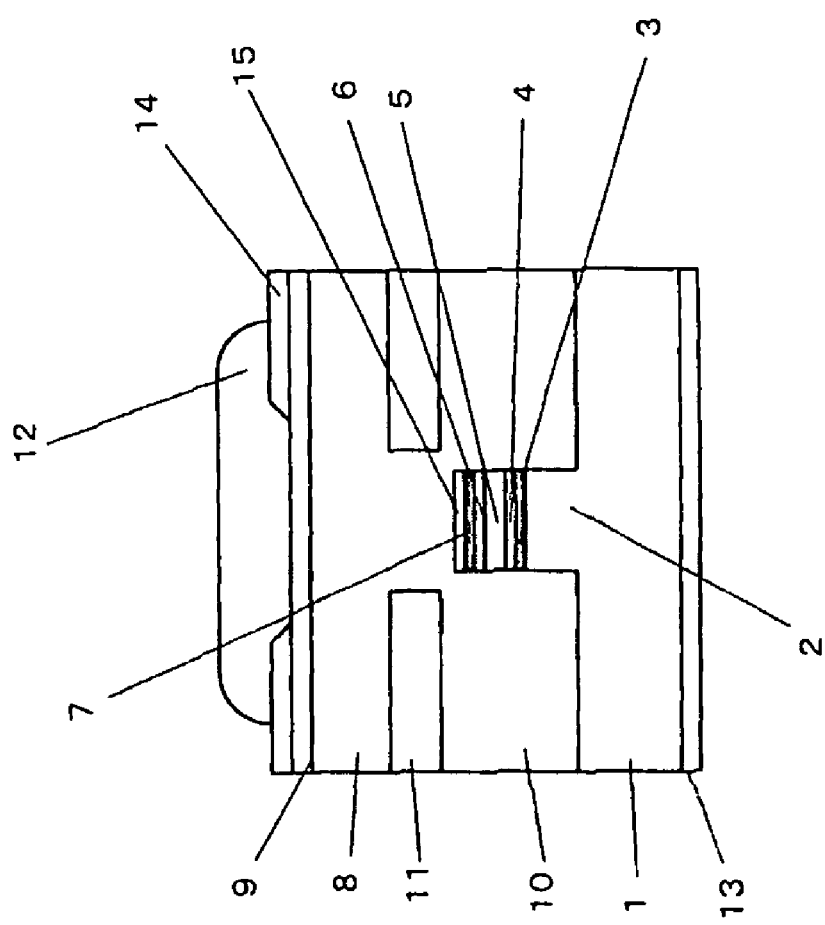
FIG. 3 is a schematic sectional view showing a configuration of an optical semiconductor device (buried-heterostructure semiconductor laser) according to a modification to the embodiment.

For example, while, in the embodiment described above, the p-type InP upper cladding layer 8 is formed just above the p-side InGaAs-based intermediate layer 7, formation of the p-type InP upper cladding layer 8 is not limited to this. For example, as shown in FIG. 3, the p-type InP upper cladding layer 8 may be formed on the p-side InGaAs-based intermediate layer 7 through a p-type InGaAsP-based semiconductor layer (intermediate layer; third semiconductor layer) 15 made from a p-type InGaAsP-based (including InGaAsP and InGaP) semiconductor material. In other words, the p-type InGaAsP-based semiconductor layer 15 may be inserted between the p-side InGaAs-based intermediate layer 7 and the p-type InP upper cladding layer 8. For example, a p-type In$_{0.96}$Ga$_{0.04}$As$_{0.09}$P$_{0.91}$ semiconductor layer of 10 nm thick may be inserted as the p-type InGaAsP-based semiconductor layer 15.

Similarly, while, in the present embodiment, the n-type InP buffer layer 2 is formed just under the n-side InGaAs-based intermediate layer 3, formation of the n-type InP buffer layer 2 is not limited to this. For example, the semiconductor device may be configured such that the n-type InP buffer layer 2 (where the buffer layer 2 is not provided, n-type InP substrate 1) is placed under the n-side InGaAs-based intermediate layer 3 through a layer (intermediate layer) made from an n-type InGaAsP-based semiconductor material. In other words, the n-type InGaAsP-based semiconductor layer may be inserted between the n-type InP lower cladding layer (here, n-type InP buffer layer 2; where the buffer layer 2 is not provided, n-type InP substrate 1) and the n-side InGaAs-based intermediate layer 3.

In short, while, in the present embodiment, the n-side stacked structure includes InP/InGaAs/AlGaInAs layers and the p-side stacked structure includes AlGaInAs/InGaAs/InP layers, the stacked structures are not limited to them. For example, the n-side stacked structure may include InP/InGaAsP/InGaAs/AlGaInAs layers and the p-side stacked structure may include AlGaInAs/InGaAs/InGaAsP/InP layers.

Particularly, if the p-type InGaAsP layer 15 (for example, band gap wavelength of 0.95 µm) is inserted between the p-side InGaAs-based intermediate layer 7 and the p-type InP upper cladding layer as shown in FIG. 3, then the band discontinuity on the valence band side can be reduced, and as a result, the device resistance can be further reduced.

Further, while, in the present embodiment, the InGaAs-based intermediate layers 3 and 7 are inserted between the n-type InP lower cladding layer (here, n-type InP buffer layer 2; where the buffer layer 2 is not provided, n-type InP substrate 1) and the n-side AlGaInAs-based optical guide layer 4 and between the p-side AlGaInAs-based optical guide layer 6 and the p-type InP upper cladding layer 8, respectively, insertion of such InGaAs-based intermediate layer is not limited to this. In order to suppress the degradation by continuous current injection, at least the p-side InGaAs-based intermediate layer 7 may be inserted between the p-side AlGaInAs-based optical guide layer 6 and the p-type InP upper cladding layer 8.

However, since the crystallinity can be improved by inserting the n-side InGaAs-based intermediate layer 3 between the n-type InP lower cladding layer (here, n-type InP buffer layer 2; where the buffer layer 2 is not provided, n-type InP substrate 1) and the n-side AlGaInAs-based optical guide layer 4, in order to suppress the degradation by continuous current injection while improving the crystallinity, it is preferable to insert the InGaAs-based intermediate layers 3 and 7 between the layers 2 and 4 and between the layers 6 and 8, respectively, similarly as in the present embodiment.

Further, while, in the embodiment described above, the AlGaInAs/AlGaInAs strained multiple quantum well active layer is used as the active layer, the active layer is not limited to this. For example, an active layer made from a different material and having a different composition, a multiple quantum well active layer having no strain, an active layer having a different structure such as a bulk structure or a structure for which quantum dots are used, or a like active layer may be used.

Figure 4:
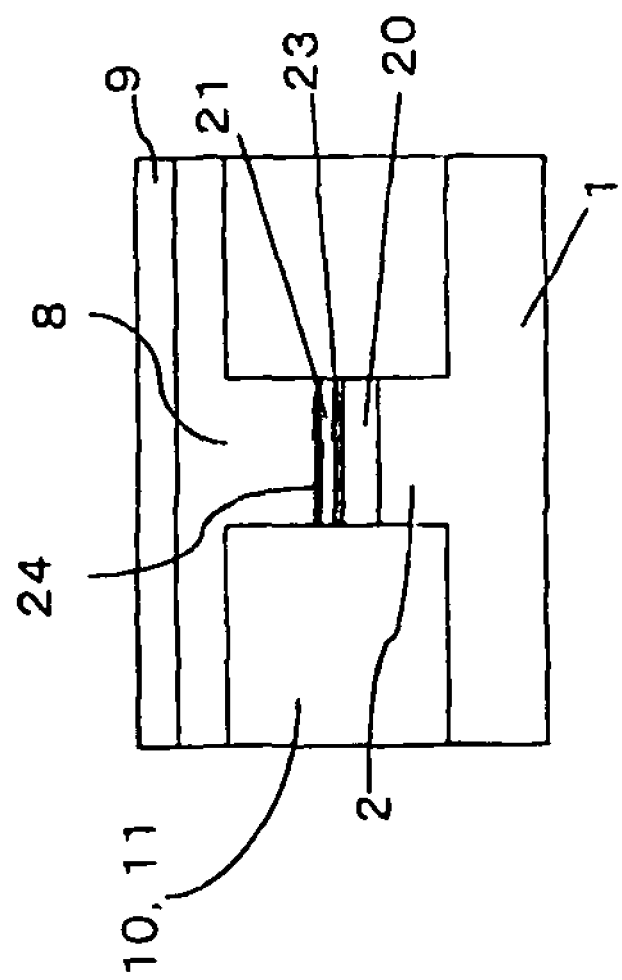
FIG. 4 is a schematic sectional view showing a configuration of an optical semiconductor device according to another modification to the embodiment.

In particular, the present optical semiconductor device may include the first semiconductor layer made from a semiconductor material containing Al, the second semiconductor layer which does not contain any one of Al and P and whose band gap is greater than that of the active layer, and the third semiconductor layer made from a semiconductor material which does not contain Al but contains P and the second semiconductor layer may be formed so as not to contact with any of the first and third semiconductor layers. For example, as shown in FIG. 4, the present invention can be applied also to an optical semiconductor device having a structure which includes an InGaAsP-based (including InGaAsP, InP, InAsP, InGaAs and InGaP) strained multiple quantum well active layer 20 and wherein a p-type AlGaInAs-based semiconductor layer 21 (here, p-type InAlAs semiconductor layer; first semiconductor layer) made from a p-type AlGaInAs-based (including AlGaInAs and InAlAs) semiconductor material is provided on the p side of the InGaAsP-based strained multiple quantum well active layer 20 in order to suppress overflow of electrons.

In this instance, the optical semiconductor device has a structure formed in such a manner that a lower InGaAs-based semiconductor layer 23 (for example, $In_{0.2}Ga_{0.8}As$ layer of 1 nm thick) made from an InGaAs-based (including InGaAs and GaAs) semiconductor material, the p-type InAlAs layer 21 (for example, of 20 nm thick), an upper InGaAs-based semiconductor layer 24 (for example, $In_{0.2}Ga_{0.8}As$ layer; second semiconductor layer) made from an InGaAs-based (including InGaAs and GaAs) semiconductor material, the p-type InP cladding layer 8 (third semiconductor layer) and the p-type InGaAs contact layer 9 are stacked on the InGaAsP-based strained multiple quantum well active layer 20 formed on the n-type InP substrate 1 through the buffer layer 2 as occasion demands and the stacked structure is processed into a mesa shape, whereafter the p-type InP burying layer 10 and the n-type InP burying layer 11 are buried in the processed stacked structure. It is to be noted that, in FIG. 4, like elements to those in the embodiment (refer to FIG. 1) described above are denoted by like reference characters.

It is to be noted here that, while the InGaAs-based semiconductor layers 24 and 23 whose compositions and thicknesses are same as each other are provided on the upper and lower sides of the p-type InAlAs layer 21, respectively, compositions and thicknesses which are different from each other may be applied to the semiconductor layers.

It is to be noted that a p-type InGaAsP-based semiconductor layer (third semiconductor layer) may be provided between the upper InGaAs-based semiconductor layer 24 and a p-type InP layer 8. In this instance, the band discontinuity on the valence band side can be reduced and the device resistance can be further reduced.

Further, while the embodiment described above is described taking the case, wherein the present invention is applied to a buried-heterostructure semiconductor laser including an optical guide layer, as an example, the present invention is not limited to this. In particular, the present invention can be applied also to a buried-heterostructure semiconductor laser without optical guide layer. In this instance, the buried-heterostructure semiconductor laser is configured such that an active layer made from a semiconductor material (for example, AlGaInAs-based semiconductor material) containing Al is provided and a p-side InGaAs-based intermediate layer is inserted between the active layer and a p-type InP upper cladding layer. The degradation by continuous current injection can be suppressed thereby. Further, in order to improve the crystallinity, an n-side InGaAs-based intermediate layer is inserted also between the active layer and the n-type InP lower cladding layer (here, n-type InP buffer layer 2; where the buffer layer 2 is not provided, n-type InP substrate 1).

Further, while, in the embodiment described above, the current blocking structure is configured as a pnpn burying heterostructure by forming a p-type InP burying layer and an n-type InP burying layer, the current blocking structure is not limited to this. For example, the current blocking structure may be configured as a semi-insulating buried heterostructure (SI—BH) or a semi-insulating blocked planar buried heterostructure (SI—PBH) using a semi-insulation InP burying layer (high-resistance semiconductor layer) such as a Fe—InP layer or the like.

Further, also as the waveguide structure, not only the pn burying waveguide described above and a burying waveguide for which a high-resistance layer is used but also a different waveguide structure such as a ridge-type waveguide or the like can be used. The device length can be selected in accordance with a design for implementing a desired performance, and also an end face coat can be applied.

Further, while the embodiment described above is described taking the Fabry-Perot type semiconductor laser as an example, the semiconductor laser is not limited to this. For example, the present invention can be applied also to a distribution feedback type (Distributed Feed-Back; DFB) laser and a distribution reflection type (Distributed Bragg Reflector; DBR) laser including a diffraction grating. Further, the present invention can be applied, for example, also to a different device such as a semiconductor modulator (for example, electric field absorption type modulator; EA modulator) having a structure similar to that of the semiconductor laser of the embodiment described above, a semiconductor laser in which semiconductor modulators are integrated or the like.

Further, while the embodiment described above is described taking the semiconductor laser formed on the n-type InP substrate (first conductive-type semiconductor substrate) as an example, formation of the semiconductor laser is not limited to this. For example, the semiconductor laser may be formed on a p-type InP substrate (second conductive-type semiconductor substrate) or on a high-resistance InP substrate (SI—InP substrate). Further, the semiconductor laser may be formed on a substrate made from a semiconductor material other than InP.

What is claimed is:

1. An optical semiconductor device, comprising:
   an active layer;
   a first semiconductor layer formed above said active layer and made from a semiconductor material containing Al;
   a second semiconductor layer formed on said first semiconductor layer and made from a semiconductor material which does not contain Al and does not contain P and whose band gap is greater than that of said active layer; and
   a third semiconductor layer formed on said second semiconductor layer and made from a semiconductor material which does not contain Al but contains P; and wherein
   said second semiconductor layer is formed such that said first and third semiconductor layers do not contact with each other.

2. The optical semiconductor device as claimed in claim 1, wherein said active layer is made from a semiconductor material containing Al.

3. The optical semiconductor device as claimed in claim 1, wherein said active layer is an AlGaInAs-based strained multiple quantum well active layer;
   said first semiconductor layer is an AlGaInAs-based optical guide layer;

said second semiconductor layer is made from an InGaAs-based semiconductor material; and said third semiconductor layer is an InP cladding layer or an InGaAsP-based semiconductor layer.

4. The optical semiconductor device as claimed in claim 2, wherein said active layer is an AlGaInAs-based strained multiple quantum well active layer; said first semiconductor layer is an AlGaInAs-based optical guide layer; said second semiconductor layer is made from an InGaAs-based semiconductor material; and said third semiconductor layer is an InP cladding layer or an InGaAsP-based semiconductor layer.

5. The optical semiconductor device as claimed in claim 1, wherein said active layer is made from an InGaAsP-based semiconductor material;

said first semiconductor layer is made from an AlGaInAs-based semiconductor material; said second semiconductor layer is made from an InGaAs-based semiconductor material;

said third semiconductor layer is an InP cladding layer or an InGaAsP-based semiconductor layer; and an InGaAs-based semiconductor layer is provided between said active layer and said first semiconductor layer.

6. The optical semiconductor device as claimed in of claim 1, further comprising:

a fourth semiconductor layer formed below said active layer and made from a semiconductor material containing Al;

a fifth semiconductor layer formed below said fourth semiconductor layer and made from a semiconductor material which does not contain Al and P and whose band gap is greater than that of said active layer; and a sixth semiconductor layer formed below said fifth semiconductor layer and made from a semiconductor material which does not contain Al but contains P; and wherein said fifth semiconductor layer is formed such that said fourth and sixth semiconductor layers dot not contact with each other.

7. The optical semiconductor device as claimed in of claim 2, further comprising:

a fourth semiconductor layer formed below said active layer and made from a semiconductor material containing Al;

a fifth semiconductor layer formed below said fourth semiconductor layer and made from a semiconductor material which does not contain Al and P and whose band gap is greater than that of said active layer; and a sixth semiconductor layer formed below said fifth semiconductor layer and made from a semiconductor material which does not contain Al but contains P; and wherein said fifth semiconductor layer is formed such that said fourth and sixth semiconductor layers dot not contact with each other.

8. The optical semiconductor device as claimed in of claim 3, further comprising:

a fourth semiconductor layer formed below said active layer and made from a semiconductor material containing Al;

a fifth semiconductor layer formed below said fourth semiconductor layer and made from a semiconductor material which does not contain Al and P and whose band gap is greater than that of said active layer; and a sixth semiconductor layer formed below said fifth semiconductor layer and made from a semiconductor material which does not contain Al but contains P; and wherein said fifth semiconductor layer is formed such that said fourth and sixth semiconductor layers dot not contact with each other.

9. The optical semiconductor device as claimed in claim 6, wherein said fourth semiconductor layer is an AlGaInAs-based optical guide layer;

said fifth semiconductor layer is made from an InGaAs-based semiconductor material; and said sixth semiconductor layer is an InP substrate or an InP buffer layer formed over said InP substrate.

10. The optical semiconductor device as claimed in claim 7, wherein said fourth semiconductor layer is an AlGaInAs-based optical guide layer;

said fifth semiconductor layer is made from an InGaAs-based semiconductor material; and said sixth semiconductor layer is an InP substrate or an InP buffer layer formed over said InP substrate.

11. The optical semiconductor device as claimed in claim 8, wherein said fourth semiconductor layer is an AlGaInAs-based optical guide layer;

said fifth semiconductor layer is made from an InGaAs-based semiconductor material; and said sixth semiconductor layer is an InP substrate or an InP buffer layer formed over said InP substrate.

12. The optical semiconductor device as claimed in claim 1, wherein said second semiconductor layer is an InGaAs layer whose thickness is 2 nm or less.

13. The optical semiconductor device as claimed in claim 2, wherein said second semiconductor layer is an InGaAs layer whose thickness is 2 nm or less.

14. The optical semiconductor device as claimed in claim 3, wherein said second semiconductor layer is an InGaAs layer whose thickness is 2 nm or less.

15. The optical semiconductor device as claimed in claim 4, wherein said second semiconductor layer is an InGaAs layer whose thickness is 2 nm or less.

16. The optical semiconductor device as claimed in claim 5, wherein said second semiconductor layer is an InGaAs layer whose thickness is 2 nm or less.

17. The optical semiconductor device as claimed in claim 6, wherein said fifth semiconductor layer is an InGaAs layer whose thickness is 2 nm or less.

18. The optical semiconductor device as claimed in claim 8, wherein said fifth semiconductor layer is an InGaAs layer whose thickness is 2 nm or less.

19. The optical semiconductor device as claimed in claim 1, further comprising a mesa structure including said active layer; and a burying layer burying said mesa structure therein.

20. An optical semiconductor device, comprising:

an active layer made from a semiconductor material containing Al;

one semiconductor layer formed on said active layer and made from a semiconductor material which does not contain Al and does not contain P and whose band gap is greater than that of said active layer; and a different semiconductor layer formed on said one semiconductor layer and made from a semiconductor material which does not contain Al but contains P; and wherein said one semiconductor layer is formed such that said active layer and said different semiconductor layer do not contact with each other.

* * * * *